(12) United States Patent
McCollin

(10) Patent No.: US 6,185,952 B1
(45) Date of Patent: Feb. 13, 2001

(54) REFRIGERATION SYSTEM FOR COOLING CHIPS IN TEST

(75) Inventor: Gerald E. McCollin, Colchester, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/345,334

(22) Filed: Jul. 1, 1999

(51) Int. Cl.⁷ .................................................. F25D 23/00
(52) U.S. Cl. ................. 62/271; 62/94; 62/259.2
(58) Field of Search .................... 62/259.2, 94, 271, 62/296, 426

(56) References Cited

U.S. PATENT DOCUMENTS

| | | |
|---|---|---|
| 2,811,223 * | 10/1957 | Newton . |
| 5,010,739 * | 4/1991 | Isshiki et al. .......................... 62/158 |
| 5,125,241 * | 6/1992 | Nakanishi et al. ..................... 62/296 |
| 5,325,676 | 7/1994 | Meckler . |
| 5,542,259 | 8/1996 | Worek et al. . |
| 5,579,647 | 12/1996 | Calton et al. . |
| 5,649,428 | 7/1997 | Calton et al. . |
| 5,653,115 | 8/1997 | Brickley et al. . |
| 5,740,018 | 4/1998 | Rumbut, Jr. . |
| 5,758,509 | 6/1998 | Maeda . |
| 5,768,897 | 7/1998 | Rainville et al. . |
| 5,931,015 * | 8/1999 | Maeda .................................... 62/271 |

* cited by examiner

Primary Examiner—William Doerrler
Assistant Examiner—Melvin Jones
(74) Attorney, Agent, or Firm—Pollock, Vande, Sande & Amernick, RLLP; James M. Leas

(57) ABSTRACT

An air cooling system including a first desiccant dryer, a second desiccant dryer connected in series in a flow path with the first desiccant dryer and a first air cooling unit connected in series in the flow path with the second desiccant dryer.

17 Claims, 2 Drawing Sheets

REFRIGERATION SYSTEM FOR COOLING CHIPS IN TEST

FIELD OF THE INVENTION

The invention relates to a method and apparatus for cooling electronic devices, such as semiconductor chips, during testing of the devices.

BACKGROUND OF THE INVENTION

To test their operability and resistance to a variety of conditions, semiconductor chips are typically subjected to a variety of tests. For example, the chips may be cooled to test their resistance to subfreezing temperatures. To carry out a test wherein a semiconductor chip is exposed to cold temperatures.

SUMMARY OF THE INVENTION

The present invention provides an air cooling system for utilization in semiconductor chip testing. The air cooling system includes a first desiccant dryer. A second desiccant dryer is connected in a series in a flow path with the first desiccant dryer. A first air cooling unit is connected in series in the flow path with the second desiccant dryer.

The present invention also provides a method for cooling and drying air. The method includes drying the air such that it comprises about 4.5 grains of moisture. The air is cooled to about 73° F. The air is further cooled and dried such that the air includes less than about 4.5 grains of moisture and is at a temperature of about −39° C. by passing the air over cooling fins cooled by a non-nitrogen based coolant.

Additionally, the present invention provides a method for cooling and drying air. The method includes transmitting air through a first desiccant dryer. The air is then transmitted through a second desiccant dryer connected in a series in a flow path with the first desiccant dryer. Next, the air is transmitted through a first air cooling unit connected in series in the flow path with the second desiccant dryer.

Furthermore, the present invention provides a method for testing a semiconductor device. The method includes arranging the semiconductor device on a testing apparatus. Air is transmitted through the first desiccant dryer. The air is then transmitted through a second desiccant dryer connected in series in a flow path with the first desiccant dryer. Subsequently, the air is transmitted through a first air cooling unit connected in series in the flow path with the second desiccant dryer. Then, the air is directed to the testing device to cool the semiconductor device.

Still further, the present invention provides a method for testing a semiconductor device. The method includes arranging the semiconductor device on a testing apparatus. Air is dried such that includes about 4.5 grains of moisture. The air is cooled to about 73° F. The air is further cooled and dried such that the air includes less than about 4.5 grains of moisture and is at a temperature of about −39° C. by passing the air over cooling fins cooled by non-nitrogen based coolant. Then, the air is directed to at least one testing device to cool the semiconductor device.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
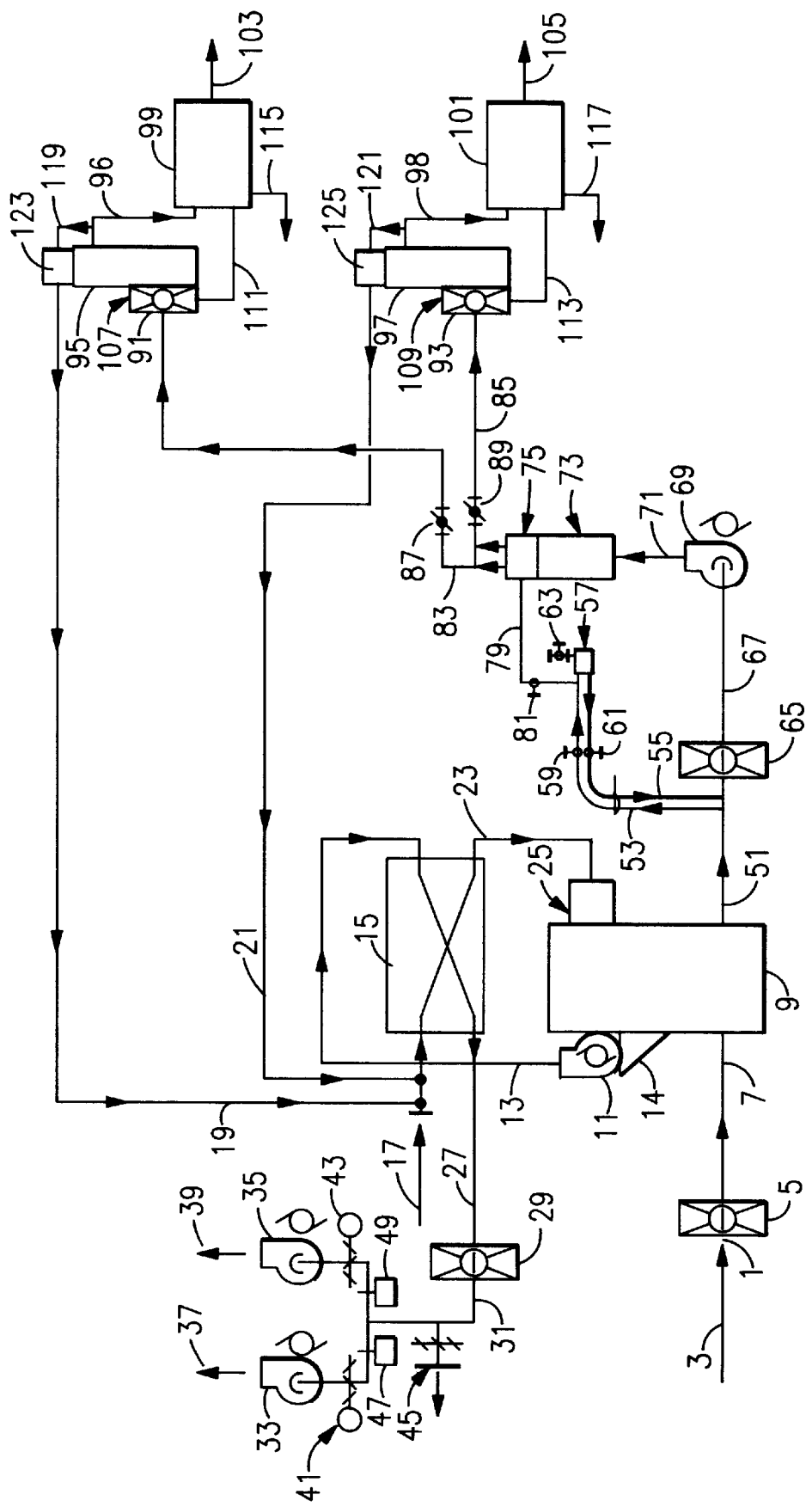
FIG. 1 represents a schematic view of an embodiment of a device according to the present invention.

Electronic devices, such as semiconductor chips are routinely subjected to tests to determine their operational characteristics and limits, among other things. As described above, one test that semiconductor chips are subjected to includes exposure to subfreezing temperatures to test operation of the chips under such conditions. Commonly, such tests, typically known as sub-cooling tests are performed on a number of chips utilizing liquid nitrogen as the cooling agent to cool the air. After the test, typically the air is quickly reheated, creating wasteful operating costs, ice build up and possible hazards to personnel.

Currently, as well as in the past, cool air typically is produced by utilizing liquid nitrogen to chill air down to about −55° C. However, liquid nitrogen may freeze condensate in a test chamber. Liquid nitrogen may be injected at −160° C. directly into a cooling chamber and then evaporated and heated to about −10° C.

The liquid nitrogen system may result in a number of problems. For example, leaks may be created in plumbing, wire access, and gasket panels. The leaks may cause condensate to freeze in the chamber. Such an apparatus may also create a safety hazard due to water melting from the chamber onto electrical components and the floor.

Additionally, such a system has a great cost for defrosting due to ice build up. In some cases, an air cooling system must be defrosted every 8 hours and can consume as much as two hours in extreme cases. These problems may result in requiring additional testers and handlers to meet production requirements.

The present invention provides a solution to the above-described problems and others by providing a system that permits a fast turn around to be carried out in switching from hot to cold air testing without a significant loss in manufacturing time due to equipment freeze-up typically encountered in processes that utilize liquid nitrogen. While overcoming these problems, the present invention still maintains the capability of sub-freezing temperature testing.

In short, the present invention provides an air cooling system that includes a first desiccant dryer. The system also includes a second desiccant dryer connected in series in a flow path with the first desiccant dryer. A first air cooling unit is connected in series in the flow path with the second desiccant dryer.

By including two desiccant dryers in series, a second dryer may be located in a processor closer to where the air will be utilized rather than in a central location. This decreases the chance of moisture reentering the air stream. Additionally, locating a second dryer on a cooling unit may occupy less space and also decrease the chance of moisture migration back into the system. This may at least in part because the air is cooled right after drying. This decreases the chance of moisture seeping into the air prior to cooling. Including only one dryer may make a system according to the present invention too big and/or too noisy.

While typical embodiments of the present invention include two desiccant dryers, the present invention may include any number of desiccant dryers. For example, a system according to the present invention may include more than two desiccant dryers. Along these lines, a system according to the present invention could include a plurality of second desiccant dryers. According to such embodiments, the first desiccant dryer may be in series with the plurality of second desiccant dryers. According to such an embodiment, air would flow from the first desiccant dryer along a plurality of different flow paths to each of the second desiccant dryers. Therefore, the plurality of second desiccant dryers may be considered to be connected in parallel.

Any desiccant dryer may be included in the system according to the present invention. One specific example of a desiccant dryer is a silica gel desiccant dryer with electric heater available from Cargoair.

A system according to the present invention may also include a second air cooling unit in series in the flow path between the first desiccant dryer and the second desiccant dryer. As with the desiccant dryers, the present invention may include any suitable air cooling unit. One example of a suitable air cooling unit is a PGC unit available from Parameter Generation and Control, Inc. of Black Mountain, N.C.

While any air cooling unit may be utilized, the first and/or the second air cooling unit may be dehumidifying. Additionally, either the first and/or second air cooling unit may be a multi-stage cooling unit. Along these lines, either one or both of the air cooling units may include a chilled water cooling coil. Additionally, the first air cooling unit may include multiple stages of direct expansion coils.

A system according to the present invention may further include a third air cooling unit. A third air cooling could be arranged upstream from and in series with the first desiccant dryer. Such a third air cooling unit would cool air before the air enters the first desiccant dryer.

While the air cooling units according to the present invention referred to as first, second and third, it is not necessary that a system according to the present invention include more than one air cooling unit. Additionally, the at least one air cooling unit could be arranged in any position in the system. For example, the at least one air cooling unit could be arranged an any position where the first, second and/or third air cooling unit may be arranged as described herein. Of course, a system according to the present invention could include two air cooling units arranged in any position, such as two of the positions described herein for an air cooling unit.

According to the present invention, the desiccant dryer(s) and air cooling unit(s) may be arranged in a variety of configurations. Along these lines, the desiccant dryer(s) and air cooling unit(s) may be arranged in close proximity to each other. According to one example, the air cooling system according to the present invention includes a second desiccant dryer arranged adjacent to a first air cooling unit. According to a variation of this embodiment, the second desiccant dryer is integrated with the first air cooling unit. According to another variation of this embodiment, the second desiccant dryer is arranged on top of the first air cooling unit.

As is evident from this discussion, the desiccant dryer(s) and air cooling unit(s) may be arranged in any configuration relative to each other. However, some configurations may provide particular advantages as compared to others. For example, some embodiments, such as the one described above where a desiccant dryer is arranged in the vicinity of or as with the air cooling unit may provide an advantage of being more compact then other embodiments.

The capacity of the system according to the present invention to remove moisture and cool air may vary depending upon the embodiment as well as the desired characteristics of the air to be treated by the system. Typically, if a system according to the present invention includes a first desiccant dryer and second desiccant dryer, the first desiccant dryer removes a first portion of moisture from air passing therethrough and the second desiccant dryer removes an additional portion of moisture from the air passing therethrough. The amount of moisture that each desiccant dryer removes from the air may vary depending upon the embodiment. According to one embodiment, air flowing out of the second desiccant dryer has a moisture content of less than 1 grain.

Significantly, it should be noted that the temperature, moisture content, flow rates, and other characteristics of air treated with a system according to the present invention may vary, depending upon, among other factors, the temperature and moisture content of the input air and the requirements for the end use of the air. Similarly, the characteristics of the air may vary at any point within a system according to the present invention. For example, reference is made herein to processing air such that at a first stage is has a moisture content of about 4.5 grains. This could be greater or lesser, depending at least in part upon the properties of the air input into the system at input 3.

After being treated by a system according to the present invention, air may be directed toward to at least one process tool. A process tool may be for the purpose of testing semiconductor chips. The air may also be for other processes. Along these lines, a testing apparatus that utilizes air treated according to the present invention may not necessarily be for treating a semiconductor chip. In fact, it can be utilized for testing other electronic components.

The relationship of the system according to the present invention relative to the process tool may vary. According to one embodiment, the system according to the present invention is remote from the process tool. According to other embodiments, the system according to the present invention is in close proximity to the process tool.

According to some embodiments, one or more elements of a system according to the present invention may be remote from or in close proximity to a process tool that is to utilize air processed by the system. In accordance with such embodiments, while some elements may be located in close proximity to the process tool, other elements may be remote from the process tool. Along these lines, a first desiccant dryer included in a system according to the present invention may be located remote from a process tool that utilizes air cooled and dried by the system while a second desiccant dryer may be arranged in close proximity to the process tool.

According to some embodiments, the present invention also includes a distribution system for distributing air cooled and dried by the system from the first air cooling unit or other element of the system to a plurality of process tools.

To encourage flow of air through a system according to the present invention, the present invention may include at least one fan. The at least one fan for directing and encouraging air flow through the system may be arranged in a plurality of positions. For example, the at least one fan could be located at an inlet of the system. The at least one fan could also be located at an outlet of the system downstream from an air cooling unit or desiccant dryer. According to an embodiment where at least one fan is arranged in the vicinity of an outlet of the system, the at least one fan could be located in the vicinity of the cooling unit or desiccant dryer or in the vicinity of the process tool. The at least one fan may also be located anywhere in the air flow path through the system.

The present invention may also include a plurality of fans. For example, a fan could be located at an inlet of the system while a second fan could be located in the vicinity of an outlet of the system. A fan located in the vicinity of an outlet of the system could be considered an exhaust fan for discharging air from the system.

As described below in greater detail, a system according to the present invention may include more than one outlet. However, the present invention includes at least one outlet at a process tool. This outlet may be connected to some sort of manifold to direct air at and/or through the process tool. Therefore, the "outlet" may not be an outlet in a strict sense. However, a system according to the present invention may also include one or more outlets that vent air from the system entirely.

For further controlling and monitoring a system according to the present invention, the system may include at least one sensor for detecting characteristics of air flowing through the system. At least one sensor may be a temperature sensor. Alternatively, the at least one sensor may be a humidity sensor. The humidity sensor could comprise wet and dry bulb thermometers. Other types of sensors that could be included in a system according to the present invention include dew point sensor(s), pressure sensor(s), and manual water flow sensors (s).

The present invention may also include more than one sensor. For example, a system according to the present invention may include at least one temperature sensor and at least one humidity sensor. Naturally, the present invention may include any number of temperature, humidity, and/or other types of sensors.

The sensor or sensors may be arranged at any location within air flow path in the system according to the present invention. For example, the at least one sensor could be arranged at the outlet of the system to determine whether the air matches the desired parameters. A plurality of sensors may also be arranged at various locations throughout the system to monitor conditions at any desired point in the system.

To further monitor operation of a system according to the present invention, the system may include at least one sampling line for sampling air flowing through the system. The at least one sampling line may be located at any location in the system. For example, at least one sampling line could be located at the exit of the system to sample the air exiting the system to determine whether it has the desired characteristics of air treated by the system. The at least one sampling line could also be located at any other point in the system. Some embodiments may include a plurality of sampling lines to sample air at various locations throughout the system. Providing a sampling line and/or at least one sensor downstream of any element of the system, such as any desiccant dryer or any air cooling unit may help to more closely monitor the performance of an individual element of the system.

According to some embodiments, a system according to the present invention may include at least one recycling line for recycling at least a portion of the air flowing through the system. According to such embodiments, air that is not able to be used by a process tool may be recycled through the system rather than being disposed of or vented to the atmosphere. This may help to save money as compared to a system not including at least one recycling line.

Typically, as with many other apparatuses utilized in semiconductor device manufacturing, a system according to the present invention may have people working in the vicinity of the system. Accordingly, the present invention may include at least one sound attenuator for attenuated sound generated by the system. The sound attenuator may be arranged at any one or more locations in the system.

FIG. 1 schematically illustrates an embodiment of an air drying system according to the present invention. This embodiment is shown and described simply to provide one example of the present invention. This example should be considered illustrative and not restrictive.

Air enters the embodiment of the system illustrated in FIG. 1 at inlet 1 indicated by arrow 3. A system illustrated in FIG. 1 includes a cooling coil 5 through which the air first flows. Air then flows along flow path 7 to first desiccant dryer 9.

A regeneration exchange fan 11 may remove a portion of the air flowing into the first dryer through outlet 13. Any fan may be utilized here with any desired power. According to one embodiment, a fan having about 3 horsepower may be utilized as fan 11.

Air removed from the first desiccant dryer may travel flow path 13 toward a flat plate air to air heat recovery unit 15. Air may also flow into the heat recovery unit from a regeneration air supply 17 and from recirculation or recycling lines 19 and 21 for recycling a portion of the air from elements of the system downstream of the desiccant dryer 9.

In the heat recovery unit, heat exchangers transfer heat from air flowing into the flat plate air to air heat recovery unit 15 from the flow paths 17, 19 and 21 into air flowing from the first desiccant dryer 9 through flow path 13. Air input into the heat recovery unit 15 from flow paths 17, 19 and 21 exits the heat recovery unit through flow path 23 to flow back toward the first desiccant dryer 9. From flow path 17 to flow path 23, the air temperature may increase from about 72° F. to about 114° F. dry bulb temperature.

Prior to entering the first desiccant dryer, the air may flow through a regeneration heater unit 25. The heater unit 25 may operate with electric or gas or any other type of heat. According to one example, the heater unit 25 is electric and generates about 84 kilowatts of heat.

After flowing through the heat recovery unit 15, air that was removed from the first desiccant dryer through flow path 13 may flow out of the heat recovery unit through flow path 27 toward a regeneration cooling unit 29. Air flowing through the regeneration recooling unit 29 may exit the unit through flow path 31. The cooling unit 29 recools the air and removes moisture prior to releasing the air to the environment. This can help to reduce any environmental output from the process. In cold outside conditions, removing moisture from the air prior to venting the air to the atmosphere can reduce formation of ice and/or snow as the moist air encounters the cold atmosphere. Such ice and/or snow could build up and present a hazard.

The air may flow through flow path 31 toward regeneration air exhaust fans 33 and 35. Air may exit exhaust fans 33 and 35 as indicated by arrows 37 and 39. In an embodiment such as that illustrated in FIG. 1 that includes two exhaust fans arranged as indicated in FIG. 1, one of the exhaust fans may be on-line while the other may be on standby. The standby fan could activate upon failure of the on-line fan.

Arranged in the flow path 31, upstream of each fan may be a motorized back draft damper 41 and 43. The dampers may prevent air flow back through flow path 31 away from fans 33 and 35 toward the regeneration recooling unit 29. The motorized back draft dampers may be wired such that they open upon starting of fans 33 and/or 35.

Also arranged in flow path 31 may be a barometric relief damper 45. The barometric relief damper may provide a pressure outlet in the event that pressure exceeds a certain level.

Flow switches 47 and 49 may be arranged within the flow paths just prior to dampers 41 and 43. The flow switches indicate that air is flowing through the system at those locations. If desired, the flow switches can alert an operator in the event the air movement ceases.

As discussed above, air entering the heat recovery unit 15 through flow paths 17, 19 and 21 may be directed back toward the first desiccant dryer 9. This air and a portion of the air not removed by the regeneration exchange fan 11 may exit the first desiccant dryer 9 through flow path 51.

As stated above, a system according to the present invention may include at least one sampling line. The embodiment illustrated in FIG. 1 includes two sampling lines 53 and 55. Sampling lines 53 and 55 may remove a portion of the air flowing through flow path 51.

As also stated above, the present invention may include at least one sensor. For example, the embodiment illustrated in FIG. 1 includes a dew point indicator 57 arranged in the sampling lines 53 and 55.

A system according to the present invention may include at least one valve to control flow of air through the system. For example, the embodiment illustrated in FIG. 1 includes valves 59, 61, and 63 to control flow of air flowing through the sampling lines 53 and 55. As can be seen in FIG. 1, air exiting flow path 51 through sampling lines 53 may be returned to the flow path 51 through sampling line 55.

Flow path 51 leads from first desiccant dryer to cooling coil 65. Cooling coil 65 as cooling coil 5 serves to help cool the air flowing therethrough. Any type of cooling unit may be utilized here. According to one example, the cooling unit is a chilled water cooling unit. Additionally, the amount that the cooling unit 65 cools the air may depend upon the input air and the desired output. According to one example, air input into the cooling unit 65 has a temperature of about 99° F., dry bulb. According to this example, the cooing unit cools the air to a temperature of about 73° F., dry bulb. Air exits cooling coil 65 through flow path 67.

At this point in the flow path, a fan 69 may be located to facilitate movement of air through the system. The fan may be a high pressure supply fan. While any fan could be utilized here, a fan having a horsepower of about 15 could be utilized. The operational parameters of the fan may vary. According to one example, air exits the fan at a flow rate of about 3500 cubic feet per minute. According to this example, fan produces a static pressure of about 10 inches, operates at a speed of about 1628 revolutions per minute, and has a brake horse power of about 8.22. Air can exit this fan at a velocity of about 2823 feet per minute. Of course, as stated about with respect to the temperature and moisture content of the air, the fan operational parameters may vary. Air exits the fan 69 through flow path 71.

It is at this point in the flow path that a sound attenuator 73 may be arranged. Air may exit the sound attenuator through discharge plenum 75.

As indicated by flow path 79, a portion of the air may be discharged by the discharge plenum toward the dew point indicator 57. A valve 81 arranged in flow path 79 may permit this flow path to be opened and closed. Valve 81 may operate in cooperation with valves 59 and 61 to control which air is supplied to the dew point indicator. This may permit the dew point of the air to be sampled at various locations in the system.

At the point where the air is discharged from the discharge plenum, the flow path may split directed the air along two different flow paths 83 and 85. Each flow path 83 and 85 may lead to a second desiccant dryer and cooling unit and to one or more process tools. Valves 87 and 89 may control flow of air through the flow paths 83 and 85. Valves 87 and 89 may be butterfly dampers.

Each flow path 83 and 85 may lead to a second cooling unit 91 and 93. The second cooling unit is located upstream and directly adjacent second desiccant dryers 95 and 97.

From the second cooling unit, the flow path in the embodiment illustrated in FIG. 1 leads into a second desiccant dryer 95 and 97. First cooling units 99 and 101 are arranged downstream from the second desiccant dryers 95 and 97, respectively. Air may flow from the second desiccant dryers to the first cooling units through flow paths 96 and 98.

As indicated by flow paths 119 and 121, a portion of the air exiting the second desiccant dryers may not be directed through flow paths 96 and 98 and eventually toward the process tools but rather flow through flow paths 119 and 121 toward the heat recovery unit 15. Fans 123 and 125 may help to direct the flow of air through flow paths 119 and 121.

The air may be redirected rather than discarding it. By supplying previously dried air to dryer 9, this may also help to ensure that the dryer 9 can work less hard if desired as compared to if the dryer only received air through flow path 7. This could improve the reliability of the dryer as well as decreasing the heat required to run it.

Second cooling units 91 and 93 may chill the air utilizing chilled water. On the other hand, first air cooling units 99 and 101 may chill the air utilizing chilled water and/or refrigerant-based system. The refrigerant system may utilized any typical refrigerant, such as freon or freon replacement compounds.

Figure 2:
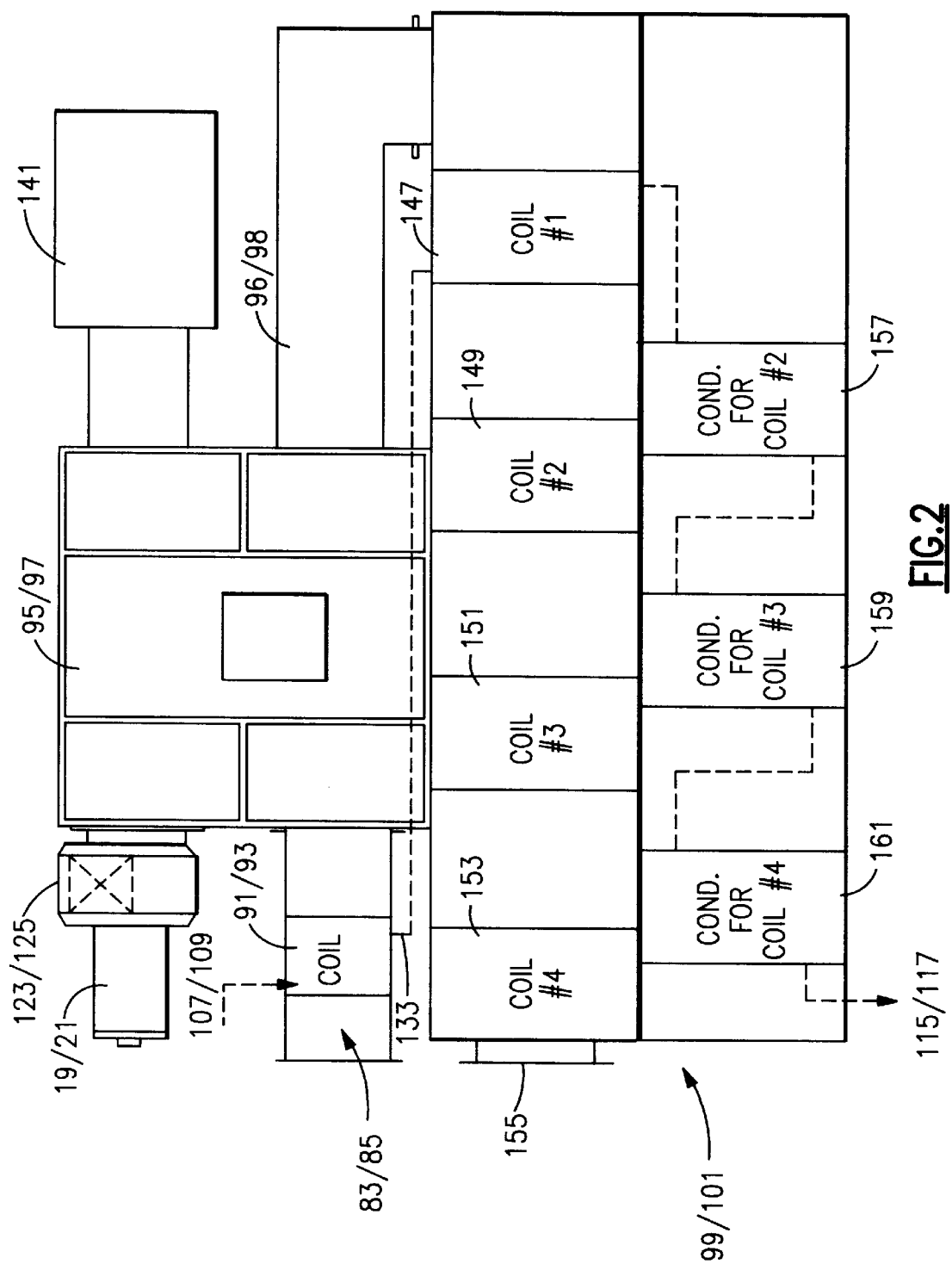
FIG. 2 represents a cross-sectional schematic view of one embodiment of an air cooling unit that may be utilized in a cooling system according to the present invention.

FIG. 2 illustrates one embodiment of a first air cooling unit along with a second desiccant drier and second cooling unit that may be utilized according to the present invention. The embodiment illustrated in FIG. 2 includes an inlet for receiving air from flow paths 83 and 85 from the parts of the system upstream in the flow paths from the first air cooling unit. Air entering the embodiment shown in FIG. 2 first encounters second cooling unit 91/93. For clarity, reference numbers from FIG. 1 will be utilized whenever possible in the description of the portion of the system shown in FIG. 2.

In this embodiment, the second cooling unit 91/93 is a chilled water cooling coil. The first cooling coil receives chilled water from a chilled water supply 107/109. The chilled water may come from an existing chilled water supply in any manufacturing facility.

As indicated by broken line 111/113, the chilled water may be directed to other cooling coils in the first air cooling unit. According to one embodiment, air entering the first second cooling unit 91/93 has a temperature of about 75° F., a moisture content of about 5 to about 6 grains and a flow rate of about 1540 SCFM. After exiting the first cooling coil, the air may have a temperature of about 54° F.

As stated above, the properties of the air entering the system and operational requirements may vary the characteristics of the air at any point within the system. Also, importantly, the flow rates provided herein represent values in standard cubic feet per minute. If the air is not at standard temperature and pressure, these values will differ.

After leaving the second cooling unit 91/93, the air will travel to second desiccant dryer 95/97. Second desiccant dryer 95/97 can operate as any desiccant dryer described herein. The second desiccant dryer in the embodiment illustrated in FIG. 2 can reduce the moisture content of the air to less than about 1 grain. In one particular embodiment, the moisture content is reduces to about 0.073 grain. The air can exit the second desiccant dryer at a temperature of about 66.8° F. and at a flow rate of about 1200 SCFM. This portion of the air discharged through second desiccant dryer may exit through flow path 96/98.

A reactivation heater access panel 141 may be arranged adjacent the second desiccant dryer.

Part of the air entering second desiccant dryer 95/97 will exit through flow path 19/21 to be recirculated back to a heat recovery unit as discussed above. Flow of air may be facilitated by fan 123/125. This recycled air, or reactivation discharge air, may have a temperature of about 140° F., a moisture content of about 22.3 grains and a flow rate of about 340 SCFM. Unlike the embodiment illustrated in FIG. 1, where the reactivation discharge air is shown splitting off from flow paths 96 and 98 after the desiccant dryer, the reactivation discharge air in the embodiment illustrated in FIG. 2 exits directly from the second desiccant dryer.

Air exiting the second desiccant dryer through flow path 96/98 passes into first air cooling unit 99/101. The embodiment of the first air cooling unit shown in FIG. 2 utilizes four cooling coils. The cooling coils in the first air cooling unit can rely on any type of cooling. For example, the cooling coils can be chilled water or conventional refrigerant based cooling coils. In the embodiment represented in FIG. 2, one of the cooling coils is a chilled water while three of are direct expansion cooling coils.

Air flows from flow path 96/98 into a first cooling coil 147. This first cooling coil, labeled coil #1 in FIG. 2, is a chilled water cooling coil. According to one embodiment, cooling coil 147 outputs air have a temperature of about 55° F., a moisture content of about 0.073 grains, and a flow rate of about 1200 SCFM.

Air exiting cooling coil 147 then flows to cooling coil 149. Cooling coil 149 can chill the air to about −3° F., while not altering its moisture content or flow rate. This cooling coil is labeled as cooling coil #2 in FIG. 2. Unlike cooling coil 147, cooling coil 149, in the embodiment shown in FIG. 2 is a direct expansion cooling coil.

The embodiment of first air cooling unit 99/101 illustrated in FIG. 2 includes two more cooling coils, 151 and 153. These cooling coils are labeled as coils 3 and 4, respectively, in FIG. 2. Similar to cooling coil 149, cooling coils 151 and 153 are direct expansion cooling coils in the embodiment illustrated in FIG. 2. Air exiting cooling coil 151 may have a temperature of about −30° F., with the same flow and moisture content of air exiting cooling coil 149. Air may then flow to cooling coil 153. Air exiting cooling coil 153 may have a temperature of approximately −39° F., again, with the same flow and moisture content of air exiting cooling coils 151 and 149. Air exits the first air cooling unit at output 103/105.

The first air cooling unit represented in FIG. 2 also includes condensers 157, 159, and 161 for cooling the refrigerant prior to introducing the refrigerant into direct expansion cooling coils 149, 151, and 153. After exiting the condenser 161 for direct expansion cooling coil 153, the chilled water may be returned to the system through exits/flow paths 115 and 117.

By utilizing chilled water in the cooling units, an existing chilled water producer may be utilized in a system according to the present invention. Chilled water may enter the second cooling units through cooling water inputs 107 and 109. The cooling water may exit the second cooling units and flow toward the first cooling units through flow paths 111 and 113. The chilled water may exit the first cooling units through exits/flowpaths 115 and 117.

Air exits the system through exit flow path 103 and 105. By including more than one flow path out of the discharge plenum and eventual outlet from the system, a system according to the present invention may produce more than one flow of supply air having more than one characteristic. In other words, air flowing from the first cooling unit 99 may have different properties than air flowing from the first cooling unit 101.

While air may flow through a system according to the present invention at any desired rate and the temperature and humidity may be controlled at any desired degree, the following provides an example of air flowing through the system illustrated in FIG. 1, providing flow rates and moisture contents and dew point measurements. Along these lines, air may be input into the system at input 1 at a maximum rate of about 3,080 cubic feet per minute.

According to one example, the air input into the system has a dry bulb temperature of about 75° F. and a wet bulb temperature of about 63° F. The air may have a moisture content of about 68 grains.

The air exiting the cooling coil through flow path 7 may have a dry bulb temperature of about 47° F. and a wet bulb temperature of about 46.9° F. This air may have a moisture content of about 47 grains. The first desiccant dryer 9 may have a flow capacity of about 4500 cubic feet per minute.

Air removed from the first desiccant dryer by the regeneration exchange fan 11 may be removed from the first desiccant dryer at a rate of about 1,035 cubic feet per minute. The air flowing through the fan may have a dry bulb temperature of about 120° F. and have a moisture content of about 169 grains. Air flowing through flow path 31 toward exhaust fan 33 and 35 may have a dry bulb temperature of about 71° F. and a wet bulb temperature of about 69° F.

Air flowing into the heat recovery unit 15 from regeneration air supply 17 may flow at a rate of about 355 cubic feet per minute. This air may have a dry bulb temperature of about 75° F. and a moisture content of about 68 grains. On the other hand, air flowing into the heat recovery unit 15 that has been recycled from the second desiccant dryers through flow lines 19 and 21 may flow at a rate of about 340 cubic feet per minute. This air may have a temperature of about 140° F. (or 60° C.) and a moisture content of about 23 grains per pound.

Air flowing out of the heat recovery unit 15 toward the first desiccant dryer may flow at a rate of about 1,035 cubic feet per minute and have a dry bulb temperature of about 114° F. This air may have a moisture content of about 40 grains.

Air flowing through flow path 51 from first desiccant dryer to cooling coils 65 may have a dry bulb temperature of about 99° F. and a wet bulb temperature of about 67° F. This air may have a moisture content of about 4.5 grains.

After leaving a cooling coil 65 and entering flow path 67, the air may flow at a rate of about 3080 cubic feet per minute. This air may have a dry bulb temperature of about 73° F. and a wet bulb temperature of about 47° F. This air may have a moisture content of about 4.5 grains.

Air exiting the discharge plenum 75 of the vertical sound attenuator 73 may flow through flow paths 83 and 85 at a rate of about 1540 cubic feet per minute. This air may have a dry bulb temperature of about 75° F. and a moisture content of about 4.5 grains. Of course, air may flow through flow pass 83 and 85 at different rates.

Air exiting the system toward process tools through flow paths 103 and 105 may have a temperature of approximately −39° C. The flow rate through these flow paths may be about 1200 standard cubic feet per minute to feed air to 16 tools each requiring a flow of about 70 SCFM. Of course, the flow rate may vary, depending at least in part on the heat gain from the particular tools that the air is being supplied to. Other embodiments could have flow rates greater or lesser than 1200 SCFM. For example, the flow rate could be 2400 SCFM or 3400 SCFM. Air flowing through flow paths 96 and 98 from second desiccant dryers 95 and 97 to first cooling units 99 and 101 may flow at a rate of about 1200 cubic feet per minute.

As discussed above, the present invention also provides methods for cooling and drying air. The methods include transmitting air through a system such as that described above. The methods may alternatively or additionally be considered to include drying the air and cooling the air such that it has the desired moisture and temperature characteristics. The drying and cooling may take place in more than one stage.

The present invention also includes methods for testing a semiconductor device. Similar to the methods of cooling and drying air, the methods for testing a semiconductor device may include arranging a semiconductor device and in or on a testing apparatus and transmitting air through a system according to the present invention and then directing the air to the testing device to cool the semiconductor device and carrying out the testing of the semiconductor device. Alternatively and/or additionally, methods for testing a semiconductor device according to the present invention may include drying and cooling the air such that it has characteristics discussed above. The air may then be directed to the testing device and the semiconductor device tested.

As indicated in FIG. 1, some moisture may be removed by the first desiccant dryer. The air may then be shipped at room temperature to several process areas rather than being cooled down. When arriving in close proximity to the process areas, the air may be cooled and dried more. Along these lines, the air may be cooled by the second cooling unit to about 20° C. The second desiccant dryer may then dry it further and the first cooling unit may further chill it down to about −39° C. The air may then be distributed through duct port to several tools. According to one embodiment, a system such as that illustrated in FIG. 1 provides air to at least 16 testing apparatuses. Of course, more or less test apparatuses could be supplied with air from the system.

At least some embodiments of the present invention may be considered to comprise a split desiccant air conditioning system that combine produces cold air at subfreezing temperatures, down to about −39° C. and transmits this air through a duct system to individual testers economically and without coil freeze up. The desiccant dryer(s) may include rotating honeycomb wheels utilizing silica gels as an absorbent. Another absorbent that could be utilized is lithium chloride.

The desiccant dryers can include a heater that removes moisture from the air. Such heaters, often referred to as reactivation heaters could be electric, steam, indirect-fired gas, or direct-fired gas. However, lithium chloride typically cannot be utilized in a dehumidifier that uses direct-fired gas reactivation. The wheel in such an apparatus could be damaged.

The final cooling of the air supply may be achieved utilizing a self-contained air handling unit. As discussed above, an existing chilled water system may be utilized for condensation purposes. Refrigerant compressors may also be utilized coupled with a direct expansion coil for the final cooling. The air cooling system equipment according to the present invention may create a constant volume system.

As discussed above, a relief duct may be included in a system according to the present invention. The relief duct is not shown in FIG. 1. However, it is arranged downstream of any testing tools supplied with air by the system. According to one example, a relief duct is arranged under a floor, such as a raised floor typically utilized in computer installations. The chilled air could, when supplied through a relief duct, supplement or replace, at least temporarily, the air conditioning system typically necessary to cool the computer installation. Air could also be redirected back to the input of the entire system at flow path 3.

An advantage of a system according to the present invention is that it can operate 24 hours per day, 7 days a week. This is at least in part due to the lack of problems associated with liquid nitrogen chillers discussed above. As a result, the relief duct described above can be very useful, especially to avoid wasting the chilled air.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

I claim:

1. An air cooling system, comprising:
    a first desiccant dryer;
    a second desiccant dryer connected in series in a flow path with the first desiccant dryer;
    a first air cooling unit connected in series in the flow path with the second desiccant dryer; and
    a device for testing an electronic component wherein air cooled and dried by the system is directed to said device.

2. The system according to claim 1, wherein the second desiccant dryer is arranged adjacent to the first air cooling unit.

3. The system according to claim 2, wherein the second desiccant dryer is integral with the first air cooling unit.

4. The system according to claim 1, further comprising:
    a plurality of second desiccant dryers, wherein the first desiccant dryer is in series with the plurality of second desiccant dryers.

5. The system according to claim 1, wherein the first desiccant dryer is remote from a process tool that utilizes air cooled and dried by the system and the second desiccant dryer is in the proximity of the process tool.

6. The system according to claim 1, wherein the first desiccant dryer removes a first portion of moisture from air passing therethrough and the second desiccant dryer removes an additional portion of moisture from the air passing therethrough.

7. The system according to claim 1, wherein air cooled and dried by the system is interconnected with said device.

8. The system according to claim 1, further comprising:
a distribution system for distributing air cooled and dried by the system from the first air cooling unit to a plurality of process tools.

9. The system according to claim 1, further comprising:
at least one fan for directing air through the first desiccant dryer, the second desiccant dryer and the cooling unit.

10. The system according to claim 1, further comprising:
at least one temperature sensor and at least one humidity sensor for detecting characteristics of air flowing through the system.

11. The system according to claim 1, further comprising:
at least one sound attenuator for attenuating sound generated by the system.

12. The system according to claim 1, further comprising:
at least one exhaust fan for discharging air from the system.

13. The system according to claim 1, further comprising:
at least one sampling line for sampling air flowing through the system.

14. The system according to claim 1, wherein air coming out of the second desiccant drier is colder than air coming out of the first desiccant drier.

15. A method for cooling and drying air, the method comprising the steps of:
- transmitting the air through a first desiccant dryer;
- transmitting the air through a second desiccant dryer connected in series in a flow path with the first desiccant dryer; and
- transmitting the air through a first air cooling unit connected in series in the flow path with the second desiccant dryer;
- wherein moisture is not intentionally added to air cooled and dried by the system.

16. A method for testing a semiconductor device, the method comprising:
- arranging the semiconductor device in a testing apparatus;
- transmitting the air through a first desiccant dryer;
- transmitting the air through a second desiccant dryer connected in series in a flow path with the first desiccant dryer;
- transmitting the air through a first air cooling unit connected in series in the flow path with the second desiccant dryer; and
- directing the air to the testing device to cool the semiconductor device.

17. An air cooling system, comprising:
- a first desiccant dryer;
- a second desiccant dryer connected in series in a flow path with the first desiccant dryer; and
- a first air cooling unit connected in series in the flow path with the second desiccant dryer;
- wherein the system includes no humidifier for intentionally adding moisture to air cooled and dried by the system.

* * * * *